United States Patent
Da Silva Esteves et al.

(10) Patent No.: US 12,413,446 B2
(45) Date of Patent: Sep. 9, 2025

(54) SYSTEM TO IMPROVE CAN COMMUNICATIONS BETWEEN MICROCONTROLLERS

(71) Applicant: BOSCH CAR MULTIMEDIA PORTUGAL, S.A., Braga (PT)

(72) Inventors: Marco António Da Silva Esteves, Braga (PT); Emanuel José Rodrigues Da Silva, Covelas (PT); José Rui Amorim Gomes, Braga (PT)

(73) Assignee: BOSCH CAR MULTIMEDIA PORTUGAL, S.A., Braga (PT)

( * ) Notice: Subject to any disclaimer, the term of this patent is extended or adjusted under 35 U.S.C. 154(b) by 0 days.

(21) Appl. No.: 18/687,392

(22) PCT Filed: Dec. 22, 2021

(86) PCT No.: PCT/IB2021/062145
§ 371 (c)(1),
(2) Date: Mar. 26, 2024

(87) PCT Pub. No.: WO2023/118934
PCT Pub. Date: Jun. 29, 2023

(65) Prior Publication Data
US 2024/0356776 A1    Oct. 24, 2024

(30) Foreign Application Priority Data

Dec. 21, 2021   (PT) .......................................... 117654

(51) Int. Cl.
*H04L 12/40*    (2006.01)
*H03K 19/20*    (2006.01)

(52) U.S. Cl.
CPC ........ *H04L 12/40169* (2013.01); *H03K 19/20* (2013.01); *H04L 2012/40215* (2013.01)

(58) Field of Classification Search
CPC .... H04L 12/40169; H04L 2021/40215; H03K 19/20
(Continued)

(56) References Cited

U.S. PATENT DOCUMENTS

| | | |
|---|---|---|
| 10,754,997 B1 * | 8/2020 | Daily .................... H04L 12/417 |
| 2014/0365693 A1 * | 12/2014 | Monroe .................... G06F 3/00 710/105 |
| 2016/0036604 A1 | 2/2016 | Mori et al. |

FOREIGN PATENT DOCUMENTS

DE    102015012002 A1    3/2017

OTHER PUBLICATIONS

Dr. Jens Barrenscheen, et al., "On-Board Communication via Can Without Transceiver", Siemens, pp. 1-2, 1996.
(Continued)

*Primary Examiner* — Dominic D Saltarelli
(74) *Attorney, Agent, or Firm* — LUCAS & MERCANTI, LLP

(57) ABSTRACT

A system to improve CAN communications between microcontrollers, where the CAN Transceiver is completely discarded and replaced with a galvanic isolated solution. With the proposed solution, it is possible to obtain CAN data transfer rates of 8 Mbps (however theoretically can go as high as baud rates of 12 Mbps depending on the type of galvanic isolation) while ensuring galvanic isolation between microcontrollers. It balances reducing the necessary hardware while maintaining or outperforming all the functionalities that a CAN transceiver with full galvanic isolation implemented would provide. The discrete hardware has a wide range of operability in different scenarios from wide voltage ranges or no common ground while being ideal for high speed transfers between microcontrollers while maintaining all the advantages that a CAN communication provides, either be built in error detection or robust-
(Continued)

ness with bit monitoring, bit stuffing, frame check, acknowledgement check and cyclic redundancy check.

5 Claims, 2 Drawing Sheets

(58) Field of Classification Search
USPC .......................................................... 375/219
See application file for complete search history.

(56) References Cited

OTHER PUBLICATIONS

International Search Report and Written Opinion for Corresponding International Application No. PCT/IB2021/062145, 11 pages, Sep. 30, 2022.

* cited by examiner

SYSTEM TO IMPROVE CAN COMMUNICATIONS BETWEEN MICROCONTROLLERS

CROSS-REFERENCE TO RELATED APPLICATIONS

This application is a 371 of PCT/IB2021/062145, filed Dec. 22, 2021, which claimed the priority of Portuguese Patent Application No. 117654, filed Dec. 21, 2021, the contents of each of which are incorporated herein by reference.

TECHNICAL FIELD

The present application describes a system to improve CAN communications between microcontrollers.

BACKGROUND ART

There are different approaches to use Controller Area Network (CAN) and/or Controller Area Network Flexible Data-Rate (CAN-FD) as a communication protocol to exchange data between microcontrollers or transceivers in the same printed circuit board (PCB) system, or different PCB subsystems galvanic isolated from each other. This protocol is valuable in applications with high security and safety needs, in which Galvanic isolation between subsystems is a requirement.

With regard to transceiver communication, a transceiver that leverages a simple CAN bus line, Single Wire CAN (SWC) Bus, is normally called Single Wire Transceiver. On this type of operation (leveraging), there is only one communication line used instead of the typical CAN High and Low signals. This approach has advantages related to the automatic detection and handling of ground loss, built in thermal shutdown on but output, among others. The low level of the required hardware implementation for developing this valid operating bus line are perfect for cost-sensitive and effective applications, such as to power windows and door locks, seats and mirror controls and internal digital temperature gauges in automotive applications. However, there are some limitations addressed to the data transmission speeds since this type of transceivers normally operate between 33 Kbps and 100 Kbps. This limitation on the speed rate reduces the amount of data that is possible to transmit in a second when compared to a CAN-FD that is capable of achieving 8 Mbps of data transfer rates. Therefore, these Single Wire Transceivers are limited once they transmit as much as 240 times less data than the CAN-FD.

In a particular example, a fail-operational behavior implies that a system continues to perform a predefined set of intended functions to a defined extent, with a defined performance, for a defined time, in case of a certain number of failures is detected. The availability of fail-operational systems is safety related, meaning that, among other measures, the system must be able to tolerate certain failures. Fault tolerance is always based on some sorts of redundancy; however, redundancy alone does not ensure a fail-operational behavior since it must also comprise mechanisms to trade information between the redundant hardware and even redundant software. The communication protocol used for that purpose must incorporate safe mechanisms while exchanging information between entities at high-speed transfer rates. A particular case of fail-operational systems application is, for example, related with steering angle sensors since they are a sensor of critical importance in vehicle operation since it can place a user or the surrounding environment of said vehicles in serious harm and danger situations.

At least for these reasons, the functional safety of these devises is also an issue that must be approached in future developing sensors, which will have to ensure the development of functional safety compliant sensors with Automotive Safety Integrity Level (ASIL) D classification. To achieve this performant level, the redundancy at both software and hardware level must be ensured.

Therefore, the solution for the problem consists of choosing a protocol that allows the exchange of critical information between subsystems with the required redundancy, while ensuring electrical isolation between subsystems.

SUMMARY

The present invention describes a system to improve data communications between two microcontrollers, microcontroller A and microcontroller B, characterized by comprising a set of diodes, diode A and a diode B, installed in series in a Tx output line of a CAN controller comprised in each of the two microcontrollers, said diodes installed inversely with respect to the Tx output lines data flow; an isolation barrier, installed in series in a Rx input line B of a CAN controller B of the microcontroller B and in series with an anode output of diode B connected to the Tx output line B of the CAN controller B, adapted to provide an isolated Rx input line B and an isolated Tx output line B; and a pull-up resistor A connected with a first terminal to a voltage regulator A and a second terminal connected simultaneously to the isolated Rx input line B, to the isolated Tx output line B, to a Rx input line A of a CAN controller A of the microcontroller A and an anode output of diode A connected to a Tx output line A of the CAN controller A.

In a proposed embodiment of present invention, the system comprises an AND logic gate comprised of a first input simultaneously connected to the second terminal of the pull-up resistor A, whose first terminal is connected to the voltage regulator A, and to the anode output of diode A; a second input simultaneously connected to a second terminal of a pull-up resistor B, whose first terminal is connected to a voltage regulator B, and to the isolated Tx output line B; and an output simultaneously connected to the isolated Rx input line B and the Rx input line A of the CAN controller A of the microcontroller A.

Yet in another proposed embodiment of present invention, the pull-up resistor A, and the set of diodes connected to the Tx output lines are configured to improve response times of the data communications through reducing a determination range value of logic "1" and logic "0".

Yet in another proposed embodiment of present invention, the logic "1" corresponds to a voltage level of 3.3V and the logic "0" corresponds a voltage level of 2V.

Yet in another proposed embodiment of present invention, the data communications between the two microcontrollers are performed over a galvanic isolated single wire bus.

GENERAL DESCRIPTION

The present invention describes a system to improve communications between microcontrollers. The proposed solution aims to obtain a performant isolation level between communicating microcontrollers, while achieving maximum baud rate of 8 Mbps using CAN protocol.

The difference between a Single Wire CAN, and the proposed implemented solution, is related with the data rate transfers whereas the new solution can achieve several times higher data rates, from 80 up to 240 times faster, while maintaining the possibility to configure it to all possible range of values to a maximum of 8 Mbps. Furthermore, the new solution approach also includes galvanic isolation, which is a requirement for this implementation.

There are several approaches for the current invention, where one of the proposed architectures does not resort to the use of transceivers, not using differential communication lines, and therefore, not having any type of isolation, being the transfer rates capping at 1 Mbps. Additionally, variations for this solution approach can be implemented, while maintaining the same operating principle.

The normal operation of the insulated transceiver fulfils the intended galvanic separation in the new invention. It only falls short in two features, the amount of the hardware required, and the data rates to which they are appropriate, achieving a maximum of 5 Mbps whereas the new invention achieves baud rate up to 8 Mbps, resulting in an improvement of 60%.

In order to overcome state of the art limitations, other solutions can be considered that enable higher transmission rates in shorter communication lengths. One approach resort to the use of a set of diodes in order to ensure the correct data direction, all connecting the transmission and receiving lines to a single communication wire line, thus creating a valid CAN Classic bus line. The set of diodes must comply with fast recovery times, such as Schottky type diodes, enabling therefore higher transmission rates. Some of the identified limitations of the proposed approach were related to the lack of noise immunity, and the limited line distance, which is smaller than 1 m, making its use only advisable and suitable for inter microcontroller communication where the mean distance is about 20 cm.

To overcome these issues, and ensure the isolation between transceivers, only one of the transceivers used in the system is required to have this isolation feature, while the other do not. With this layout arrangement it is possible to achieve transfer bit rates up to 5 Mbps while ensuring proper electric and noise isolation. On the downside, this approach requires the incorporation of additional hardware in the system, which does not add much gain, since the distances for communication are so small, nonetheless it ticks most of the boxes about ensuring a proper and safe communication.

BRIEF DESCRIPTION OF THE DRAWINGS

For better understanding of the present application, figures representing preferred embodiments are herein attached which, however, are not intended to limit the technique disclosed herein.

DESCRIPTION OF EMBODIMENTS

With reference to the figures, some embodiments are now described in more detail, which are however not intended to limit the scope of the present application.

Figure 1:
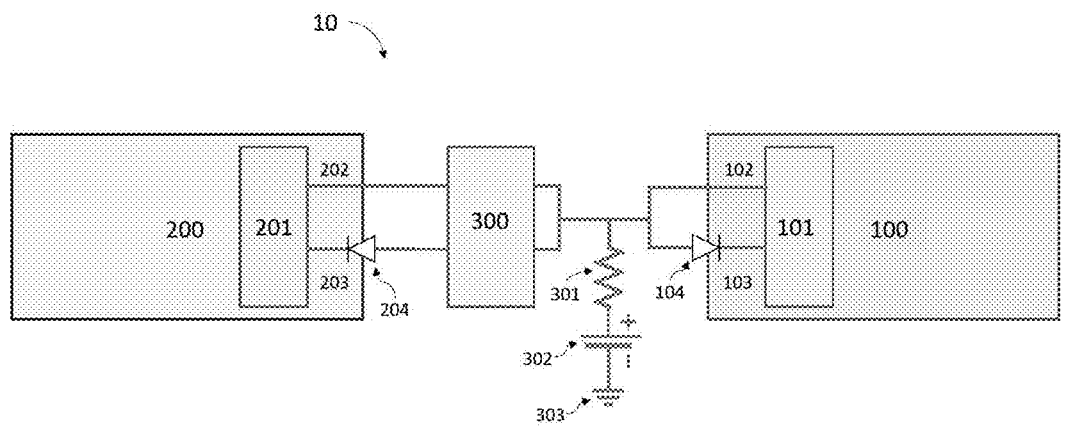
FIG. 1—represents an embodiment for the proposed communication system, where the reference numbers are related to:
10—communication system;
100—microcontroller A;
101—CAN controller A;
102—Rx input line A;
103—Tx output line A;
104—diode A;
200—microcontroller B;
201—CAN controller B;
202—Rx input line B;
203—Tx output line B;
204—diode B;
300—isolation barrier;
301—pull-up resistor A;
302—voltage regulator A;
303—ground A.

In one of the proposed embodiments of the present invention, depicted in FIG. 1, the developed system (10) comprises two microcontrollers (100, 200) connected and communicating through transmitting and receiving lines, i.e., Tx and Rx lines. Each of the microcontrollers (100, 200) comprises a CAN controller (101, 201) incorporated with a Tx output line (103, 203) and a Rx input line (102, 202). The transmitting and receiving lines of developed communication system (10) comprise a pull-up resistor, i.e., resistor A (301), and fast recovery diodes (104, 204) connected to the Tx output lines (103, 203) in order to improve response times. The diodes (104, 204) are used to ensure the desired direction of the flowing current, while the pull-up resistor (301) is needed to ensure the idle state of the CAN bus, important to check if the bus is free. If for some reason, the bus line differs from the high value defined by the pull-up resistor A (301), it means that the bus is being used and the message must be queued. Additionally, it may be used a voltage regulator A (302) for the pull-up resistor (301), since voltage typically is either 3V or 5V depending on the microcontroller (100, 200), that will be responsible for minimizing the variance of voltage range interpreted by the microcontroller (100, 200), stabilizing the triggering value, and eliminating ambiguous situations of digital value interpretation such as voltages of 2V which are already interpreted as a digital "1", and whereas other voltages of only above 3V are interpreted as a digital "1".

Having been defined all the hardware needs for achieving the communication over a single wire, the major challenge for the proposed architecture in this type of communication is the galvanic isolation. To ensure the galvanic isolation between communicating microcontrollers (100, 200), an integrated circuit that ensures this feature is used, i.e., and isolation barrier (300), to make the bus less sensible to electromagnetic disturbances, while achieving the proper isolation between subsystems (100, 200). For a complete isolation of the CAN bus circuits from the local system, an insulated DC-to-DC power converter is also required. FIG. 1 depicts the hardware needed, as well as the necessary connections in order to have the communication between both microcontrollers (100,200) over a single wire bus with galvanic isolation.

The proposed architecture achieves better performance in distances smaller than 1 meter, due to the fact of this implementation is electromagnetic noise sensitive. However, the smaller the distance, the lower the possible disturbance between the lines, and for the purpose of having two microcontrollers (100, 200) communicating with each other, this is a viable solution once the microcontrollers are usually placed no more than 20 cm apart from each other. Despite of having impact on electromagnetic sensitivity, the distance has also impact on the data transfer rates, mostly because of the propagation times. An electric signal takes time to propagate through a conductor, and as the signal distance from the emitter increases, the signal loses its intensity due to losses to the surrounding environment. This situation can often lead the receptor to misunderstand the data previously sent by the emitter entity since it can understand a low intensity signal as logical "0" when it should be a logical "1".

Still about the impact that distance have on this type of communication, it is important to highlight the problems related with the arbitration processes and ACK bit. In CAN-FD, the data frame is sent at two different data transfer rates. First the header of the frame is sent, which consists on defining which node the emitter wants to send the message to, and secondly the payload of the frame, usually sent at a higher speed. Taking the scenario where two nodes are distant from each other and both want to communicate at the same time, they need to compete for the bus. Considering the propagation time of the signal, they both could see the bus as free when in fact it is already in use.

Another reason that justifies the problem related with distance is the ACK bit. After the emitter node sends a CAN-FD message, the receptor node has a specific time frame, which depends on the data transfer rate, to respond with the ACK. Usually this time frame is very short, so, if the distance between the nodes is considerable then once again the propagation time could lead the system for a harsh situation.

The pull-up resistor A (301) imposes some limitations on maximum data transfer rates because of the recovery time required for signal to rise once again. The factors that influence the value of the resistor A (301) are the intended levels of electrical current and capacitance of the connections as well as the medium voltage value at each of the lines. To reduce the time of recovery, it is important for the pull-up resistor A (301) to be lowest possible while also reducing the capacitance of the wire, by reducing its size or using different materials. The problem with reducing the RC time constant is the increase of the amount of electrical current from the VDD, therefore requiring a tradeoff between speed and power dissipation.

Figure 2:
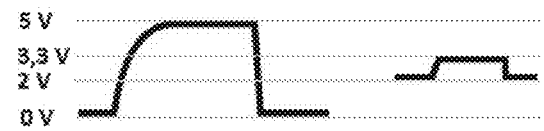
FIG. 2—depicts a visual representation of the reduced recovery time.

Another way of reducing the recovery time is reducing the value/range at which the value of logic "1" and "0" is determined. For example, if the logic "1" is any value above 3V, and any value below this is considered a logic "0", instead of having a pull-up resistor (301) for 5V, a 3.3V pull-up is enough, this immediately allows for a decrease in the pull-up time, while allowing a lower value for the resistor (301) due to the Ohm law. To further develop this concept, if the reference value is also higher for these pins, it allows for an even lower recovery time, and therefore even higher CAN speeds, as it can be seen in the comparison in the FIG. 2. This means that the open drain on the Tx lines can go the lowest of 2 Volts instead of going to zero or close to it, thus reducing even further the variation required for the transition of logic "1" state to the logic "0" and vice-versa.

Figure 3:
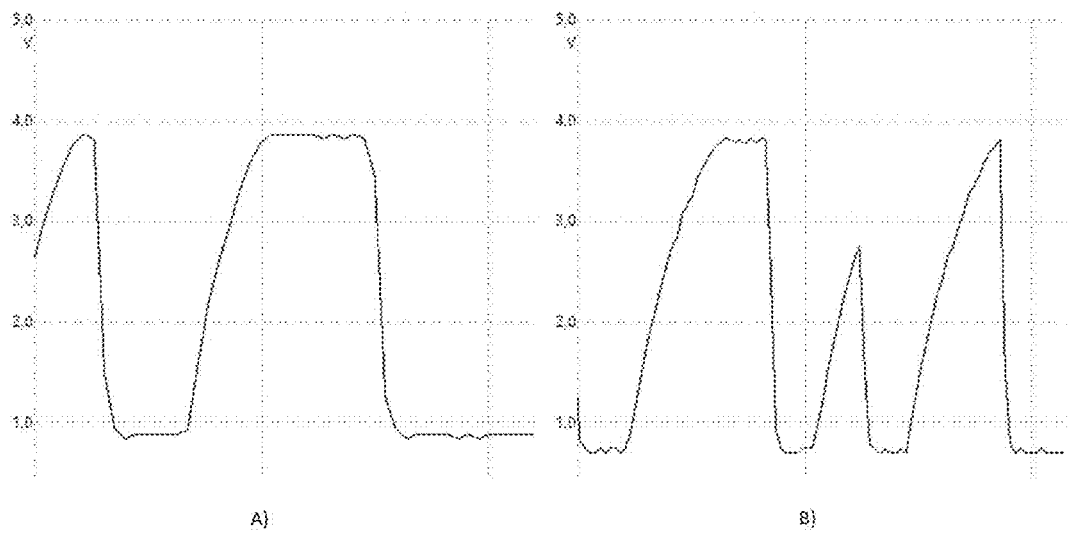
FIG. 3—represents the commutations in the lines with a pull-up resistor of 2 kΩ (A) and 4.7 kΩ (B).

The FIG. 3 shows two examples where the scenario is the same, CAN communication, where in the first the pull-up resistor (A) has 2 kΩ (±1%) and the second (B) has 4.7 kΩ (±1%). It is clear that in the second suggested scenario (B) where the recovery time is slower, it can occur the bit cut in half, where in the first suggested scenario, that does not happen. Also, the amount of time where the bit is at a high state is higher in the first scenario with a 2 kΩ (±1%) (A) rather than in the second scenario (B) with a 4.7 kΩ (±1%).

Figure 4:
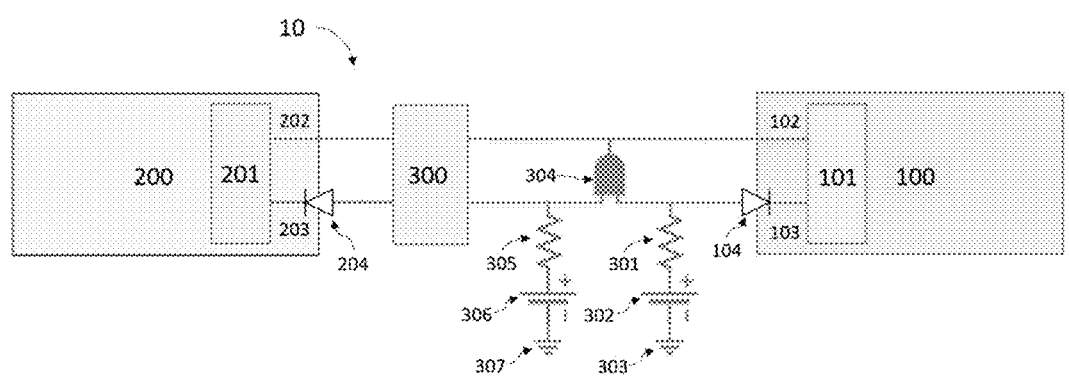
FIG. 4—represents an additional embodiment for the proposed communication system, where the reference numbers are related to:
10—communication system;
100—microcontroller A;
101—CAN controller A;
102—Rx input line A;
103—Tx output line A;
104—diode A;
200—microcontroller B;
201—CAN controller B;
202—Rx input line B;
203—Tx output line B;
204—diode B;
300—isolation barrier;
301—pull-up resistor A;
302—voltage regulator A;
303—ground A;
304—AND logic gate;
305—pull-up resistor B;
306—voltage regulator B;
307—ground B.

Another alternative for the communication between microcontrollers (100, 200) in the same system without the use of transceivers is adding an AND logic gate (304) between the Tx output lines (103, 203) and the Rx input lines (102, 202). The advantage of this approach is the addition of extra delay between the lines, if such delay is required and intended. This implementation is shown in FIG. 4.

The invention claimed is:

1. A system (10) to improve data communications between two microcontrollers, microcontroller A (100) and microcontroller B (200), comprising
    a set of diodes, diode A (104) and a diode B (204), installed in series in a Tx output line (103, 203) of a CAN (Controller Area Network) controller (101, 201) comprised in each of the two microcontrollers (100, 200), said diodes (104, 204) installed inversely with respect to the Tx output lines (103, 203) data flow;
    an isolation barrier (300), installed in series in a Rx input line B (202) of a CAN controller B (201) of the microcontroller B (200) and in series with an anode output of diode B (204) connected to the Tx output line B (203) of the CAN controller B (201), adapted to provide an isolated Rx input line B (202) and an isolated Tx output line B (203); and
    a pull-up resistor A (301) connected with a first terminal to a voltage regulator A (302) and a second terminal connected simultaneously to the isolated Rx input line B (202), to the isolated Tx output line B (203), to a Rx input line A (102) of a CAN controller A (101) of the microcontroller A (100) and an anode output of diode A (104) connected to a Tx output line A (103) of the CAN controller A (101).

2. The system (10) according to claim 1, comprising an AND logic gate comprised of
    a first input simultaneously connected to the second terminal of the pull-up resistor A (301), whose first terminal is connected to the voltage regulator A (302), and to the anode output of diode A (104);
    a second input simultaneously connected to a second terminal of a pull-up resistor B (305), whose first terminal is connected to a voltage regulator B (306), and to the isolated Tx output line B (203); and
    an output simultaneously connected to the isolated Rx input line B (202) and the Rx input line A (102) of the CAN controller A (101) of the microcontroller A (100).

3. The system (10) according to claim 1, wherein the pull-up resistor A (301), and the set of diodes (104, 204) connected to the Tx output lines (103, 203) are configured to improve response times of the data communications through reducing a determination range value of logic "1" and logic "0".

4. The system (10) according to claim 1, wherein the logic "1" corresponds to a voltage level of 3.3V and the logic "0" corresponds a voltage level of 2V.

5. The system (10) according to claim 1, wherein the data communications between the two microcontrollers (100, 200) are performed over a galvanic isolated single wire bus.

* * * * *